US011362288B2

United States Patent
Liu et al.

(10) Patent No.: US 11,362,288 B2
(45) Date of Patent: Jun. 14, 2022

(54) FLEXIBLE DISPLAY SUBSTRATE AND ITS DEFORMABLY DRIVING METHOD, A DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Junhuan Liu, Beijing (CN); Tianxiao Zhao, Beijing (CN); Ruifeng Yang, Beijing (CN); Huaxu Yang, Beijing (CN); Tong Li, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 1042 days.

(21) Appl. No.: 16/003,666

(22) Filed: Jun. 8, 2018

(65) Prior Publication Data

US 2018/0323385 A1 Nov. 8, 2018

Related U.S. Application Data

(63) Continuation-in-part of application No. PCT/CN2017/103124, filed on Sep. 25, 2017.

(30) Foreign Application Priority Data

Apr. 18, 2017 (CN) .......................... 201710255418.0

(51) Int. Cl.
*G09F 9/33* (2006.01)
*H01L 51/00* (2006.01)
(Continued)

(52) U.S. Cl.
CPC ...... *H01L 51/0097* (2013.01); *H01L 27/3244* (2013.01); *H01L 41/042* (2013.01);
(Continued)

(58) Field of Classification Search
CPC ... G09F 9/33; G09F 9/30; G09F 9/301; G09F 9/3026; G09F 9/00; G09F 9/35;
(Continued)

(56) References Cited

U.S. PATENT DOCUMENTS 3,735,031 A 5/1973 Waters
9,818,928 B2 * 11/2017 Park .................... G06F 3/016
(Continued)

FOREIGN PATENT DOCUMENTS

CN 2494994 Y 6/2002
CN 101201999 A 6/2008
(Continued)

OTHER PUBLICATIONS

Office action from Indian Application No. 201827007427 dated May 29, 2020.
(Continued)

*Primary Examiner* — Olga V Merkoulova
(74) *Attorney, Agent, or Firm* — Calfee, Halter & Griswold LLP

(57) ABSTRACT

The disclosure relates to the technical field of display, and provides a flexible display screen, a method for deformably driving the same, and a display device. The flexible display screen includes a flexible display panel and a deformable driver disposed on a back surface of the flexible display panel. The deformable driver drives the flexible display panel to deform based on the electrodeformation. The deformable driver includes a plurality of deformable units arranged in an array. The flexible display screen can achieve deformation with a variety of degrees of freedom, and can (Continued)

precisely control the deformation, thereby easy to achieve ultra-thin screen design.

15 Claims, 5 Drawing Sheets

(51) Int. Cl.
    *H01L 41/04*         (2006.01)
    *H01L 27/32*         (2006.01)
    *H01L 41/09*         (2006.01)

(52) U.S. Cl.
    CPC ...... *H01L 41/0966* (2013.01); *H01L 27/3241* (2013.01); *H01L 41/0926* (2013.01); *H01L 2251/5338* (2013.01)

(58) Field of Classification Search
    CPC ...... G09F 9/37; G09F 9/302; G09F 2013/222; G09F 21/048; G09F 13/005; G09F 19/12; G09F 19/22; G09F 21/04; G09F 27/008
    See application file for complete search history.

(56) References Cited

U.S. PATENT DOCUMENTS

| | | | | |
|---|---|---|---|---|
| 9,823,833 | B2* | 11/2017 | Grant | G06F 3/016 |
| 10,540,030 | B2* | 1/2020 | Kim | G06F 1/1616 |
| 2006/0211217 | A1* | 9/2006 | Xu | G01N 29/245 |
| | | | | 438/455 |
| 2007/0228886 | A1* | 10/2007 | Takahashi | H01L 41/0906 |
| | | | | 310/330 |
| 2011/0188189 | A1* | 8/2011 | Park | G05B 11/01 |
| | | | | 361/679.05 |
| 2014/0055394 | A1* | 2/2014 | Park | G06F 1/1652 |
| | | | | 345/173 |
| 2014/0099479 | A1 | 4/2014 | Krall et al. | |
| 2014/0204509 | A1* | 7/2014 | Park | G05D 15/01 |
| | | | | 361/679.01 |
| 2015/0187325 | A1 | 7/2015 | Teo et al. | |
| 2016/0187985 | A1 | 6/2016 | Lim et al. | |
| 2016/0195902 | A1 | 7/2016 | Huh et al. | |
| 2016/0268352 | A1* | 9/2016 | Hong | H01L 27/3218 |
| 2016/0372652 | A1 | 12/2016 | Shi et al. | |
| 2017/0083053 | A1 | 3/2017 | Chen | |

FOREIGN PATENT DOCUMENTS

| | | |
|---|---|---|
| CN | 102339166 A | 2/2012 |
| CN | 104536187 A | 4/2015 |
| CN | 104620495 A | 5/2015 |
| CN | 104916773 A | 9/2015 |
| CN | 105278835 A | 1/2016 |
| CN | 105742480 A | 7/2016 |
| CN | 106875850 A | 6/2017 |
| EP | 2700997 | 2/2014 |
| EP | 2891940 | 7/2015 |

OTHER PUBLICATIONS

Search Report and Written Opinion for International Application No. PCT/CN2017/103124 dated Nov. 30, 2017.
First Office Action for Chinese Patent Application No. 201710255418.0 dated Sep. 27, 2018.
Search Report from European Application No. 17838025.9 dated Dec. 2, 2020.
Second Office Action for Chinese Patent Application No. 201710255418.0 dated Mar. 11, 2019.

* cited by examiner

FLEXIBLE DISPLAY SUBSTRATE AND ITS DEFORMABLY DRIVING METHOD, A DISPLAY DEVICE

RELATED APPLICATION

The present application claims the priority of a Chinese patent application No. 201710255418.0 filed on Apr. 18, 2017, which is incorporated herein by reference in its entirety.

FIELD OF THE DISCLOSURE

The present disclosure relates to the technical field of display, and in particular, to a flexible display screen, a method for deformably driving the same, and a display device.

BACKGROUND OF THE DISCLOSURE

Flexible display technology has been rapidly developed in recent years, which led to great improvements of the flexible display device in terms of the screen size to display quality. Compared with traditional rigid display device, the flexible display device has many advantages, such as impact resistance, strong shock resistance, light weight, small size, portability and so on.

At present, the deformable drive of the flexible display screen mainly includes mechanical drive and user manual drive. The deformation of mechanical drive has very little freedom, and occupies a larger volume, which does not meet the requirements of thin and light mobile phone design. The user manual drive also has less freedom of deformation, and cannot precisely control the deformation.

SUMMARY OF THE DISCLOSURE

An embodiment of the present disclosure provides a flexible display screen and a method for deformably driving the same, and a display device, which can achieve a deformation with a variety of degrees of freedom, and can precisely control the deformation, thereby easy to realize the slim design of the screen.

To achieve the above objective, an embodiment of the present disclosure adopts the following technical solutions:

according to a first aspect, a flexible display screen is provided, which includes: a flexible display panel; and a deformable driver disposed on a back surface of the flexible display panel. The deformable driver drives the flexible display panel to deform based on electrodeformation; the deformable driver includes a plurality of deformable units arranged in an array.

According to an aspect of the present disclosure, the deformable unit comprises at least three branches, an angle between any two adjacent branches of the at least three branches being greater than 0° and less than 180°; wherein the at least three branches each extend outwardly from a center position of the deformable unit.

According to an aspect of the present disclosure, the deformable unit includes four branches; and the four branches are arranged in a cross shape.

The four branches in the deformable unit are fixed to the back surface of the flexible display panel by a first fixing member and four second fixing members; the first fixing member is located at center of the deformable unit for fixing four corresponding ends of the four branches simultaneously; the four second fixing members are respectively located at four edges of the deformable unit for respectively fixing the other ends of the four branches.

Further, the first fixing member comprises a rectangular fixing surface and fixing posts located at the four corners of the fixing surface; the four corresponding ends of the four branches are imbedded under the fixing surface through a gap area between two adjacent fixing posts, respectively.

According to an aspect of the present disclosure, the second fixing member comprises a top surface and side walls; the other end of each of the branches is embedded in the space region enclosed by the top surface and the side walls.

According to an aspect of the present disclosure, the first fixing member and the second fixing member are fixed to the back surface of the flexible display panel by gluing.

According to an aspect of the present disclosure, the branch of the deformable unit comprises a piezoelectric material layer.

According to one aspect of the present disclosure, each branch is a piezoelectric ceramic bimorph.

Based on the above, the flexible display panel is a flexible OLED display panel.

In a second aspect, a display device is provided, which includes the above flexible display screen.

According to an aspect of the present disclosure, the display device includes a flexible circuit board; a power supply lead of each of the deformable units in the deformable driver is connected to the flexible circuit board.

According to a third aspect, there is provided a method for deformably driving the flexible display screen according to the second aspect. The method comprises the step of: applying a voltage to each of the deformable units of the deformable driver to drive the deformable flexible display panel to deform.

Embodiments of the present disclosure provide a flexible display screen and a method for deformably driving the same, and a display device. By providing a deformable driver based on the principle of electrodeformation on the back surface of the flexible display panel, and including a plurality of deformable units arranged in an array in the deformable driver, voltages applied on each deformable unit can be controlled respectively, so as to be able to control the deformation state of the flexible display panel. Therefore, the flexible display screen provided by the present disclosure can not only precisely control the deformation, but also realize deformation with multiple states and the multiple degrees of freedom, without mechanical control, thereby easy to achieve ultra-thin flexible display panel design. In addition, the deformation of the flexible display screen of the present disclosure can be easily achieved simply by controlling the voltage applied to each deformable unit. Therefore, the flexible display screen has the advantages of being able to receive remote control, convenient and quick control of deformation, and easy programming control.

BRIEF DESCRIPTION OF THE DRAWINGS

To describe the technical solutions in the embodiments of the present disclosure or in the prior art more clearly, the following briefly introduces the accompanying drawings required for describing the embodiments or the prior art. Apparently, the accompanying drawings in the following description are merely some exemplary embodiments of the present disclosure. For those skilled in the art, other drawings may be obtained based on these drawings without any creative work.

DETAILED DESCRIPTION OF THE DISCLOSURE

The technical solutions in the embodiments of the present disclosure are clearly and completely described below with reference to the accompanying drawings in the embodiments of the present disclosure. Apparently, the described embodiments are merely a part but not all of the embodiments of the present disclosure. All other embodiments obtained by persons of ordinary skill in the art based on the embodiments of the present disclosure without creative efforts shall fall within the protection scope of the present disclosure.

Figure 1:
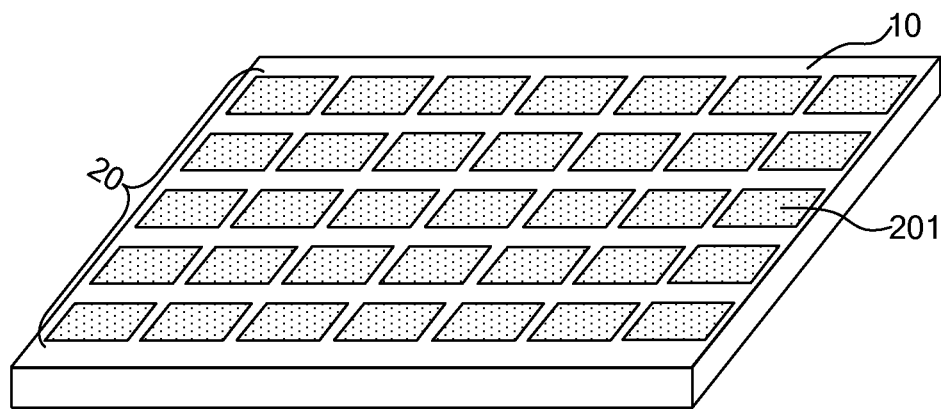
FIG. 1 is a first schematic view of a flexible display screen according to an embodiment of the present disclosure.

An embodiment of the present disclosure provides a flexible display screen, as shown in FIG. 1, the flexible display screen includes a flexible display panel 10; and a deformable driver 20 disposed on the back surface of the flexible display panel 10. The deformable driver 20 drives the flexible display panel 10 to deform based on electrodeformation; wherein the deformable driver comprises a plurality of deformable units 201 arranged in an array.

Here, the deformable driver 20 drives the flexible display panel 10 to deform based on the electrodeformation. That is, after the deformable unit 201 in the deformable driver 20 is applied with a voltage, the deformable unit 201 is bent and deformed in response to the applied voltage to drive the flexible display panel 10 to deform. In this case, the flexible display panel 10 may be bent and deformed in different forms according to different voltages applied to the respective deformable units 201.

For any one of the deformable units 201, according to different deformation states of the flexible display panel 10, a voltage other than zero may be applied thereto or no voltage may be applied thereto (that is, a zero-voltage applied).

For example, by controlling the voltage applied to each of the deformable units 201 respectively, the deformable driver 20 may be bent in the shapes as shown in FIG. 2, FIG. 3, FIG. 4 or FIG. 5 as a whole so as to drive the flexible display panel 10 to take on the same or similar deformed shape.

Figure 2:
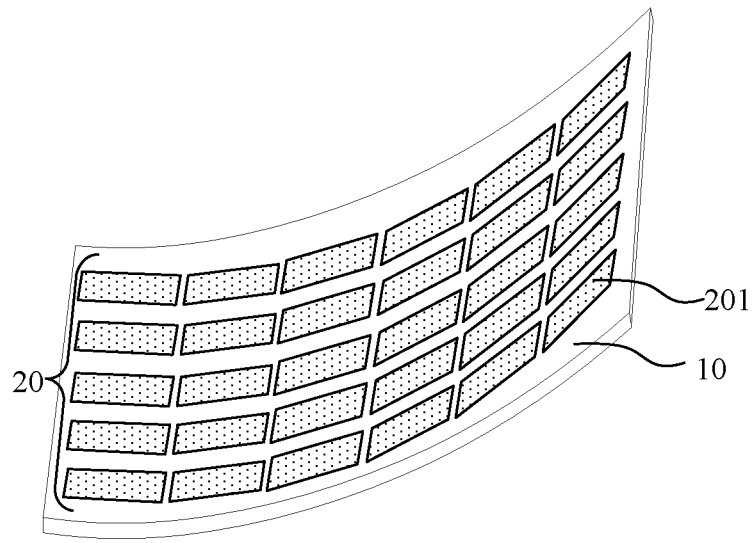
FIG. 2 is a first schematic view of a deformed flexible display screen according to an embodiment of the present disclosure.

As for the deformed shape as shown in FIG. 2, it is achieved by applying a gradually increasing (e.g., linearly increasing) voltage value to the deformable units 201 from the first column to the sixth column (from left to right), that is, the voltages applied to the respective deformable units 201 in the same row are sequentially increased from left to right while the voltage values applied to the respective deformable units 201 in the same column (from top to bottom) are the same. Therefore, the entire body is smoothly deformed from left to right.

Figure 3:
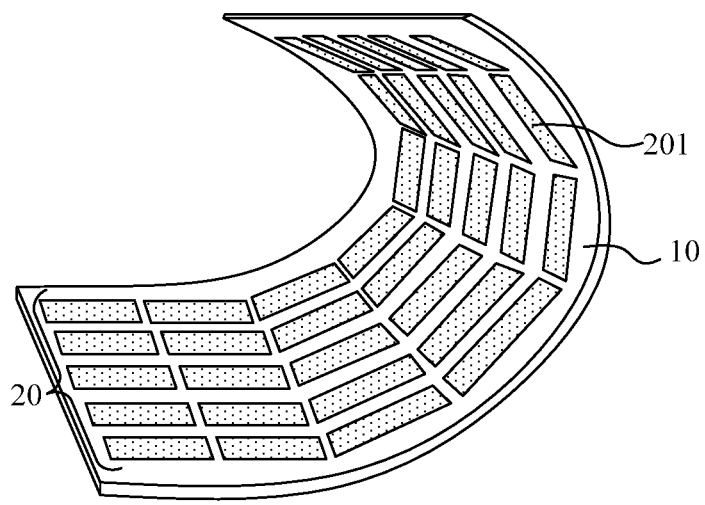
FIG. 3 is a second schematic view of a deformed flexible display screen according to an embodiment of the present disclosure.

The deformation shown in FIG. 3 is roughly similar to that shown in FIG. 2, except that the voltage values from the first column to the sixth column (from left to right) have larger increments than that in FIG. 2. Therefore, the degree of deformation is greater.

Figure 4:
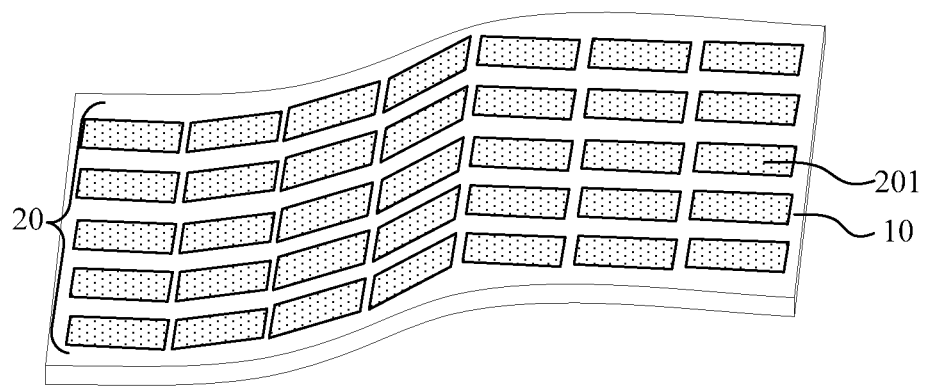
FIG. 4 is a third schematic view of a deformed flexible display screen according to an embodiment of the present disclosure.

Aa for the deformed shape as illustrated in FIG. 4, gradually increasing (e.g., linearly increasing) voltage values are applied to the deformable units 201 from the first column to the fourth column (from left to right), while 0 voltage values are applied to the deformable units 201 from fifth column to the seventh column. Therefore, the first four columns are smoothly deformed from left to right, and the last three columns are basically not deformed.

Figure 5:
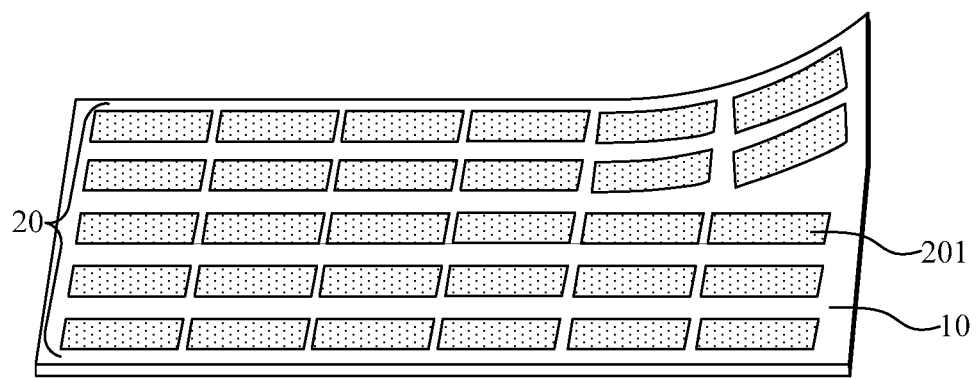
FIG. 5 is a fourth schematic view of a deformed flexible display screen according to an embodiment of the present disclosure.

The deformed shape shown in FIG. 5 is achieved by applying a voltage other than 0 to the four deformable units 201 located in the upper right corner portion while applying no voltage to the rest deformable units 201. Therefore, only the upper right corner area is deformed, while the rest is not deformed.

It should be noted that, first, the structure of the deformable unit 201 is not limited as long as bending and deforming can occur in response to the applied voltage.

Wherein, since the deformable unit 201 is deformed based on the applied voltage, it should be understood by those skilled in the art that the deformable unit 201 includes a power supply lead. The voltage is applied to the deformable unit 201 through the power supply lead.

Second, the flexible display panel 10 has a light-emitting surface, and the surface opposite to the light-emitting surface is the back surface.

Thirdly, the method for fixing the deformable units 201 in the deformable driver 20 to the back surface of the flexible display panel 10 is not limited, as long as when the deformable driver 20 is bent and deformed as a whole, it does not affect that the flexible display panel 10 deforms in the same or similar shape as the deformable driver 20 accordingly.

According to an embodiment of the present disclosure, a flexible display screen is provided. A deformable driver 20 based on the working principle of electrodeformation is disposed on a back surface of the flexible display panel 10. The deformable driver 20 includes a plurality of deformable units 201 arranged in an array. The voltage applied to each of the deformable units 201 is controlled in order to control the deformation state of the flexible display panel 10. Therefore, the flexible display screen provided by the present disclosure can not only precisely control the deformation, but also realize deformation with multiple forms and degrees of freedom, without mechanical control, thereby easy to realize slim design of the flexible display panel 10. In addition, since the flexible display screen can be deformed only by controlling the voltage applied to each of the deformable units 201, the flexible display screen of the present disclosure also has the advantages of being able to receive remote control, quick and easy deformation control, easy programming control and the like.

Figure 6:
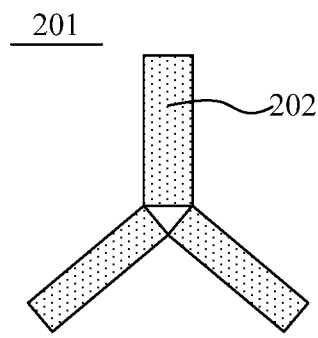
FIG. 6 is a first schematic structural view of a deformable unit according to an embodiment of the present disclosure.
Figure 7:
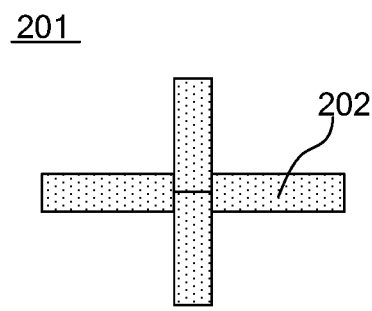
FIG. 7 is a second schematic structural view of a deformable unit according to an embodiment of the present disclosure.
Figure 8:
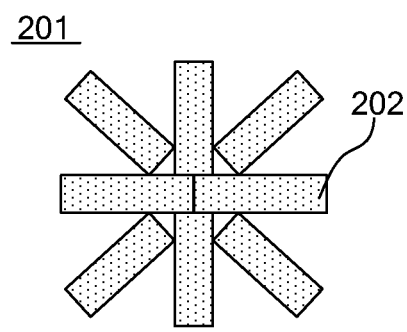
FIG. 8 is a third schematic structural view of a deformable unit according to an embodiment of the present disclosure.

According to an aspect of the present disclosure, as shown in FIGS. 6-8, the deformable unit 201 includes at least three branches 202. An angle between any two adjacent branches 202 of the at least three branches 202 is greater than 0° and less than 180°. At least three branches 202 extend outwards from the center position of the deformable unit 201. For example, the angle between the two adjacent branches 202 shown in FIG. 6 is 120°. The angle between the two adjacent branches 202 shown in FIG. 7 is 90°. The angle between two adjacent branches 202 shown in FIG. 8 is 45°.

Each branch 202 has a linear shape.

Here, as for any of the branches 202, when a voltage is applied to the branch 202, the branch 202 can be regarded as a vector, and on this basis, by controlling the magnitude of the voltage applied to each branch 202 according to the vector synthesis principle, each deformable unit 201 can be deformed in various forms so that the flexible display panel 10 can be deformed in various forms and degrees of freedom.

Figure 9:
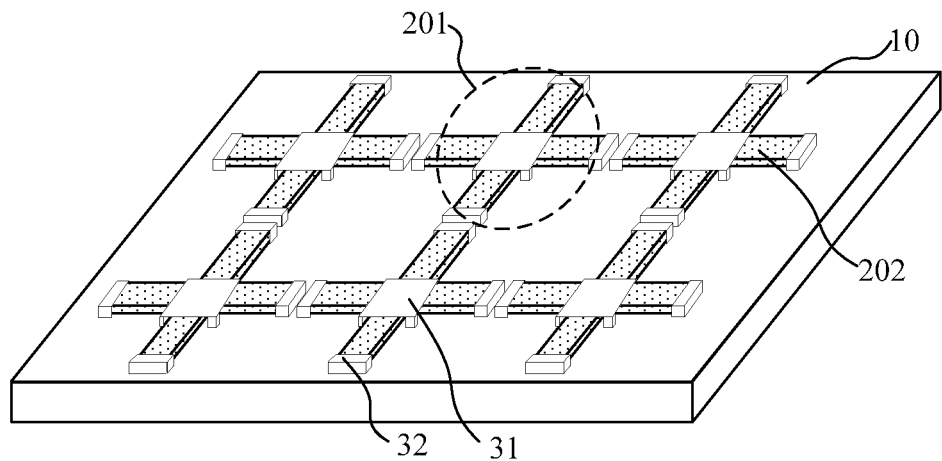
FIG. 9 is a second schematic view of a flexible display screen according to an embodiment of the present disclosure.

According to an aspect of the present disclosure, as shown in FIG. 7 and FIG. 9, the deformable unit 201 includes four branches 202; the four branches 202 are arranged in a cross shape.

Compared with the situation that the deformable unit 201 includes three branches 202, when the deformable unit 201 includes four branches 202, the flexible display panel 10 can realize slighter deformation. Compared with the situation that the deformable unit 201 includes more than four branches 202, when the deformable unit 201 includes four branches 202, the structure of the deformable unit 201 is relatively simpler and the cost is relatively lower.

Furthermore, as shown in FIG. 9, the four branches 202 in the deformable unit 201 are fixed to the back surface of the flexible display panel 10 by the first fixing member 31 and the second fixing member 32.

The first fixing member 31 is located at center of the deformable unit 201 for fixing four corresponding ends of the four branches 202 at the same time. The second fixing members 32 are respectively located at four edges of the deformable unit 201 for respectively fixing the other four ends of the four branches 202.

In the embodiment of the present disclosure, the four corresponding ends of the four branches 202 are simultaneously fixed by a first fixing member 31, and the other four ends of the four branches 202 are respectively fixed by the four second fixing members. On the one hand, each branch 202 can be effectively fixed, so that the four branches 202 are arranged in a cross shape; on the other hand, the deformation of the flexible display panel 10 is not affected by the large area distribution of the fixing members.

Figure 10:
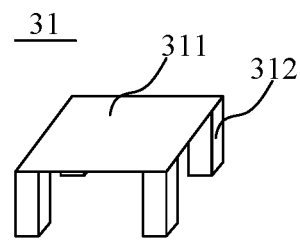
FIG. 10 is a schematic structural view of a first fixing member according to an embodiment of the present disclosure.

Furthermore, as shown in FIG. 10, the first fixing member 31 includes a rectangular fixing surface 311 and fixing posts 312 located at four corners of the fixing surface 311 and extending downward from the fixing surface. One end of each of the four branches 202 passes through a gap area between two adjacent fixing posts 312 to be embedded under the fixing surface 311.

Figure 11:
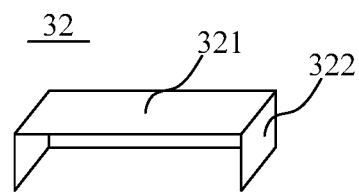
FIG. 11 is a schematic structural view of a second fixing member according to an embodiment of the present disclosure.

As shown in FIG. 11, the second fixing member 32 includes a top surface 321 and sidewalls 322 extending downward from the top surface 321. The other end of each of the branch 202 is embedded in a space region surrounded by the top surface 321 and the sidewalls 322.

By configuring the first fixing member 31 to include one fixing surface 311 and four fixing posts 312, it is relatively easy to embed the four branches 202 through the area between two adjacent fixing posts 312. On this basis, by configuring the second fixing member 32 to include the top surface 321 and the sidewalls 322, the other end of each of the branches 202 can be more easily embedded in the area surrounded by the top surface 321 and the sidewalls 322. The fixing effect of each branch 202 is better, and the fixing process of the deformable unit 201 and the flexible display panel 10 is relatively simple.

According to an aspect of the present disclosure, the first fixing member 31 and the second fixing member 32 are fixed on the back surface of the flexible display panel 10 by gluing (or by snap-fitting). That is, the first fixing member 31 and the second fixing member 32 are fixed to the back surface of the flexible display panel 10 by an adhesive material. In this way, on the one hand, the cost is low, on the other hand, the process is simple.

According to an aspect of the present disclosure, the branch 202 of the drive unit 201 includes a piezoelectric material layer.

Here, the deformation of the piezoelectric material layer is based on the reverse piezoelectric effect of the piezoelectric material. After the voltage is applied to the piezoelectric material layer, the piezoelectric material layer may undergo mechanical strain to bend and deform. When the voltage applied to the piezoelectric material layer disappears, the piezoelectric material layer can restore to its original state.

The material of the piezoelectric material layer may be a piezoelectric ceramic material or an organic piezoelectric material; the piezoelectric ceramic material may be at least one selected from the group consisting of zinc oxide (ZnO), aluminum nitride (AlN) and lead zirconate titanate. The organic piezoelectric material may be polyvinylidene fluoride (PVDF).

As the piezoelectric material can have a lot of choices, piezoelectric material with better performance and lower cost can be selected as the material of the piezoelectric material layer.

Figure 12A:
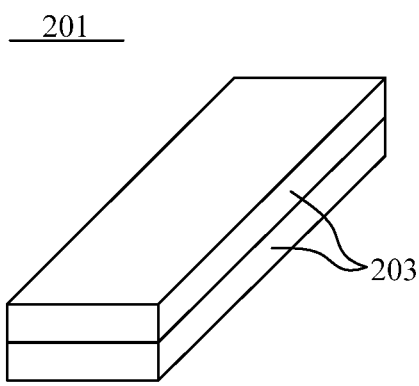
FIG. 12a is a schematic structural view of a piezoelectric ceramic bimorph provided in an embodiment of the present disclosure.

According to one aspect of this disclosure, each branch 202 is a piezoelectric ceramic bimorph. As shown in FIG. 12a, the piezoelectric ceramic bimorph consists of two identical piezoelectric ceramic sheets 203 bonded together, and the polarization directions of the two piezoelectric ceramic sheets 203 in the thickness direction are opposite.

Figure 12B:
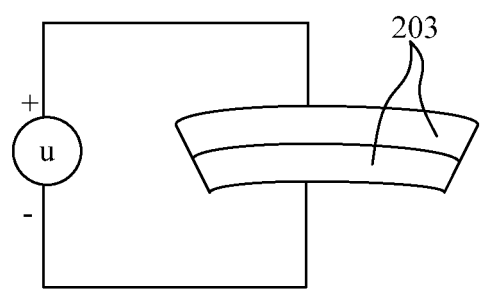
FIG. 12b is a schematic view of a deformed piezoelectric ceramic bimorph provided by an embodiment of the present disclosures.

As shown in FIG. 12b, when the piezoelectric ceramic piece 203 located at the upper portion of the piezoelectric ceramic bimorph is connected with a positive electrode and the piezoelectric ceramic piece 203 located at the lower portion of the piezoelectric ceramic bimorph is connected with a negative electrode, the piezoelectric ceramic sheet 203 located in the upper portion expands and deforms, while the piezoelectric ceramic sheet 203 located in the lower portion shrinks and deforms, so that the piezoelectric ceramic bimorph bends and deforms downwards, and the magnitude of the curvature of deformation can be controlled by the voltage. Based on the above, the OLED (Organic Light-Emitting Diode) display panel has the advantages of wide viewing angle range, uniform image quality, fast response, and it is also easily to be made flexible. Therefore, the flexible display panel 10 may be a flexible OLED display panel.

The flexible OLED display panel includes a flexible substrate and a light emitting device disposed on the flexible substrate. The light-emitting device includes an anode, an organic material functional layer, and a cathode. The organic material functional layer may include a light-emitting layer, and may further include an electron transport layer and a hole transport layer. On this basis, in order to improve the efficiency of injecting electrons and holes into the light-emitting layer, the organic material functional layer may further include: an electron injection layer between the cathode and the electron transport layer, and a hole injection layer between the hole transport layer and the anode.

An embodiment of the present disclosure further provides a display device, which includes the above flexible display screen. It has the same beneficial effects as the flexible display screen described above, and details are not described herein again.

According to an aspect of the present disclosure, the display device further includes a flexible circuit board to which a power supply lead of each of the deformable units 201 of the deformation driver 20 is connected. A voltage is supplied to each deformable unit 201 by the flexible circuit board.

By connecting the power supply lead of the deformable unit 201 to the flexible circuit board, the supply voltage of each deformable unit 201 can be controlled by the circuit on the flexible circuit board without additional control members, so as to have less impact on the overall structure of the display device.

An embodiment of the present disclosure further provides a method for deformably driving a flexible display screen. The method includes applying voltages to the respective deformable units 201 of the deformable driver 20 to drive the flexible display panel 10 to deform.

An embodiment of the present disclosure further provides a method for deformably driving a flexible display screen, which can control the deformation state of the flexible display panel 10 by separately controlling the voltage applied to each of the deformable units 201. Therefore, the flexible display screen provided by the present disclosure can not only precisely control deformation, but also realize deformation with multiple forms and degrees of freedom without mechanical control, thereby to easy realize slim design of the flexible display panel 10. In addition, since the flexible display screen can be deformed only by controlling the voltage applied to each of the deformable units 201, the flexible display screen of the present disclosure also has the advantages of being able to receive remote control, quick and easy deformation control, easy programing control and the like.

The foregoing descriptions are merely specific embodiments of the present disclosure, but the protection scope of the present disclosure is not limited thereto. Anyone skilled in the art may easily conceive changes and substitutions within the technical scope disclosed in the present disclosure. All those changes and substitutions should be covered by the scope of the present disclosure. Therefore, the protection scope of the present disclosure should be based on the protection scope of the claims.

The invention claimed is:

1. A flexible display substrate comprising:
    a flexible display panel; and
    a deformable driver disposed on a surface of the flexible display panel, wherein the deformable driver is configured to drive the flexible display panel to deform under electrodeformation, and the deformable driver comprises one or more deformable units,
    wherein each of the one or more deformable units comprises four branches, and the four branches are arranged in a cross shape, and
    wherein the four branches in the deformable unit are configured to be fixed to the surface of the flexible display panel by a first fixing member and four second fixing members, the first fixing member is located at center of the deformable unit for fixing four corresponding ends of the four branches simultaneously, and the four second fixing members are respectively located at four edges of the deformable unit for respectively fixing the other ends of the four branches.

2. The flexible display substrate according to claim 1, wherein each of the one or more deformable units comprises a piezoelectric material.

3. The flexible display substrate according to claim 1, wherein each of the one or more deformable units comprises a piezoelectric ceramic bimorph material.

4. The flexible display substrate according to claim 1, wherein each of the one or more deformable units comprises one branch in a rectangular shape.

5. The flexible display substrate according to claim 1, wherein each of the one or more deformable units comprises two branches, an angle between the two branches being 0-180°.

6. The flexible display substrate according to claim 1, wherein when the deformable driver comprises a plurality of deformable units, the plurality of deformable units are arranged in an array.

7. The flexible display substrate according to claim 1, wherein the first fixing member comprises a rectangular fixing surface and fixing posts located at the four corners of the fixing surface;
    the four corresponding ends of the four branches are respectively embedded under the fixing surface through a gap area between two adjacent fixing posts.

8. The flexible display substrate according to claim 1, wherein the second fixing member comprises a top surface and sidewalls;
    the other end of each of the branches is embedded in a space region enclosed by the top surface and the sidewalls.

9. The flexible display substrate according to claim 1, wherein the first fixing member and the second fixing member are fixed to the surface of the flexible display panel by gluing.

10. The flexible display substrate according to claim 1, wherein the flexible display panel is a flexible OLED display panel.

11. A display device comprising the flexible display substrate according to claim 1.

12. The display device according to claim 11, wherein the display device comprises a flexible circuit board, and wherein a power supply lead of each of the one or more deformable units in the deformable driver is connected to the flexible circuit board.

13. A method for deformably driving the flexible display substrate according to claim 1, comprising the step of:
    applying a voltage to each branch of the one or more deformable units through a power supply lead;
    adjusting the voltage applied to each branch of the one or more deformable units to control the electrodeformation degree of the one or more deformable units; and
    the deformable driver driving the flexible display panel to deform.

14. The method according to claim 13, further comprising collectively arranging positive or negative ends of the branches of each deformable unit together before applying the voltage to each branch of the one or more deformable units.

15. A method for manufacturing a flexible display substrate, comprising the following steps:
- providing a flexible display panel;
- fixing a deformable driver on a surface of the flexible display panel, wherein the deformable driver comprises one or more deformable units, each of the one or more deformable units comprises four branches, the four branches are arranged in a cross shape, and wherein the four branches in the deformable unit are configured to be fixed to the surface of the flexible display panel by a first fixing member and four second fixing members, the first fixing member is located at center of the deformable unit for fixing four corresponding ends of the four branches simultaneously, and the four second fixing members are respectively located at four edges of the deformable unit for respectively fixing the other ends of the four branches; and
- connecting each branch of the one or more deformable units to a corresponding voltage source through a power supply lead.

* * * * *